United States Patent
Baur et al.

(10) Patent No.: US 8,138,511 B2
(45) Date of Patent: *Mar. 20, 2012

(54) RADIATION-EMITTING SEMICONDUCTOR COMPONENT AND METHOD FOR PRODUCING THE SEMICONDUCTOR COMPONENT

(75) Inventors: Johannes Baur, Laaber (DE); Dominik Eisert, Regensburg (DE); Michael Fehrer, Bad Abbach (DE); Berthold Hahn, Hemau (DE); Volker Härle, Laaber (DE); Marianne Ortmann, Bernhardswald (DE); Uwe Strauss, Bad Abbach (DE); Johannes Völkl, Erlangen (DE); Ulrich Zehnder, Regensburg (DE)

(73) Assignee: Osram AG, Munich (DE)

( * ) Notice: Subject to any disclaimer, the term of this patent is extended or adjusted under 35 U.S.C. 154(b) by 929 days.

This patent is subject to a terminal disclaimer.

(21) Appl. No.: 11/567,977

(22) Filed: Dec. 7, 2006

(65) Prior Publication Data

US 2008/0179380 A1 Jul. 31, 2008

Related U.S. Application Data

(63) Continuation of application No. 10/657,841, filed on Sep. 9, 2003, now Pat. No. 7,169,632, which is a continuation of application No. PCT/DE02/00514, filed on Feb. 13, 2002.

(30) Foreign Application Priority Data

Mar. 9, 2001 (DE) .................................. 101 11 501

(51) Int. Cl.
 *H01L 21/00* (2006.01)
(52) U.S. Cl. ................... 257/98; 257/103; 257/E33.68; 438/46

(58) Field of Classification Search ............ 257/91–100, 257/103, 78; 438/22–47
See application file for complete search history.

(56) References Cited

U.S. PATENT DOCUMENTS

| | | | |
|---|---|---|---|
| 3,343,026 A | 9/1967 | Luechinger et al. | |
| 5,038,356 A | 8/1991 | Botez et al. | ................. 372/45.01 |
| 5,087,674 A | 2/1992 | Gardner et al. | |
| 5,087,949 A | 2/1992 | Haitz | |
| 5,814,532 A | 9/1998 | Ichihara | ........................... 438/33 |

(Continued)

FOREIGN PATENT DOCUMENTS

DE 27 27 508 A1 1/1979

(Continued)

OTHER PUBLICATIONS

English translation of the Reason for Rejection issued in the corresponding Japanese application on Jan. 30, 2009.

(Continued)

*Primary Examiner* — Savitr Mulpuri
(74) *Attorney, Agent, or Firm* — Fish & Richardson P.C.

(57) ABSTRACT

A radiation-emitting semiconductor component has an improved radiation efficiency. The semiconductor component has a multilayer structure with an active layer for generating radiation within the multilayer structure and also a window having a first and a second main surface. The multilayer structure adjoins the first main surface of the window. At least one recess, such as a trench or a pit, is formed in the window from the second main surface for the purpose of increasing the radiation efficiency. The recess preferably has a trapezoidal cross section tapering toward the first main surface and can be produced for example by sawing into the window.

31 Claims, 5 Drawing Sheets

U.S. PATENT DOCUMENTS

| | | | |
|---|---|---|---|
| 5,814,839 A | 9/1998 | Hosoba | |
| 5,821,568 A | 10/1998 | Morita et al. | 257/94 |
| 5,834,325 A | 11/1998 | Motoki et al. | 438/22 |
| 5,862,167 A | 1/1999 | Sassa et al. | 372/45 |
| 5,905,275 A | 5/1999 | Nunoue et al. | 257/95 |
| 5,907,151 A | 5/1999 | Gramann et al. | |
| 5,925,898 A | 7/1999 | Späth | |
| 6,071,795 A * | 6/2000 | Cheung et al. | 438/458 |
| 6,080,599 A | 6/2000 | Yamamoto et al. | 438/33 |
| 6,229,160 B1 | 5/2001 | Krames et al. | |
| 6,239,033 B1 | 5/2001 | Kawai | 438/693 |
| 6,239,088 B1 | 5/2001 | George et al. | 510/131 |
| 6,291,839 B1 | 9/2001 | Lester | |
| 6,432,521 B1 * | 8/2002 | Yagi et al. | 428/209 |
| 6,495,862 B1 | 12/2002 | Okazaki et al. | |
| 6,541,799 B2 | 4/2003 | Udagawa | 257/94 |
| 6,562,648 B1 | 5/2003 | Wong et al. | 438/46 |
| 6,593,159 B1 | 7/2003 | Hashimoto et al. | 438/22 |
| 6,611,002 B2 | 8/2003 | Weeks et al. | 257/94 |
| 6,677,173 B2 * | 1/2004 | Ota | 438/22 |
| 6,730,939 B2 | 5/2004 | Eisert et al. | 257/98 |
| 7,329,694 B2 | 2/2008 | Nakamura et al. | |
| 2001/0042866 A1 | 11/2001 | Coman et al. | 257/103 |
| 2002/0086454 A1 | 7/2002 | Evans et al. | 438/31 |
| 2003/0116774 A1 | 6/2003 | Yamamoto et al. | 257/94 |
| 2003/0116791 A1 | 6/2003 | Baptist et al. | |
| 2003/0127654 A1 | 7/2003 | Eisert et al. | |

FOREIGN PATENT DOCUMENTS

| | | |
|---|---|---|
| DE | 42 18 806 A1 | 12/1993 |
| DE | 43 24 325 A1 | 1/1994 |
| DE | 198 07 758 A1 | 12/1998 |
| DE | 199 27 945 A1 | 3/2000 |
| EP | 0 405 757 A2 | 1/1991 |
| EP | 0 442 002 A1 | 8/1991 |
| EP | 0 611 131 A1 | 8/1994 |
| EP | 0 810 674 A2 | 12/1997 |
| GB | 2 271 087 A | 4/1994 |
| JP | 61 110 476 | 5/1986 |
| JP | 03227078 A | 10/1991 |
| JP | 9-92878 | 4/1997 |
| JP | 10-056209 | 2/1998 |
| JP | 11-509687 | 8/1999 |
| JP | 11-354845 | 12/1999 |
| JP | 2000-196152 | 7/2000 |
| JP | 2000-340882 | 12/2000 |
| JP | 2001-007390 | 1/2001 |
| WO | 01/61765 A1 | 8/2001 |
| WO | 01/93310 A2 | 12/2001 |

OTHER PUBLICATIONS

Sze, S. M., "Physics of Semiconductor Devices", A Wiley-Interscience Publication, John Wiley & Sons, p. 848 (1981).

J. Zhang et al.: "Precise microfabrication of wide band gap semiconductors (SiC and GaN) by VUV-UV multiwavelength laser ablation", *Applied Surface Science*, vol. 127-129, 1998, pp. 793-799.

W. N. Carr: "Photometric Figures of Merit for Semiconductor Luminescent Sources Operating in Spontaneous Mode", *Infrared Physics*, 1966, vol. 6, pp. 1-19.

Japan Patent Office, "Final Reasons for Refusal (English translation)", mailed on Dec. 4, 2009 (9 pages).

\* cited by examiner

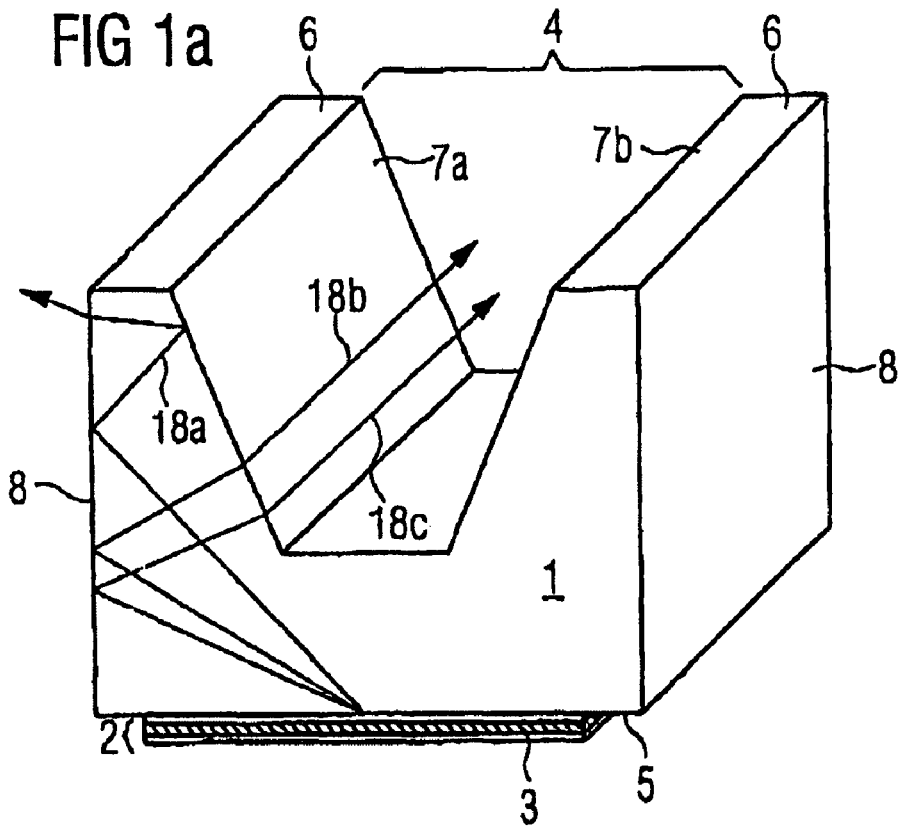
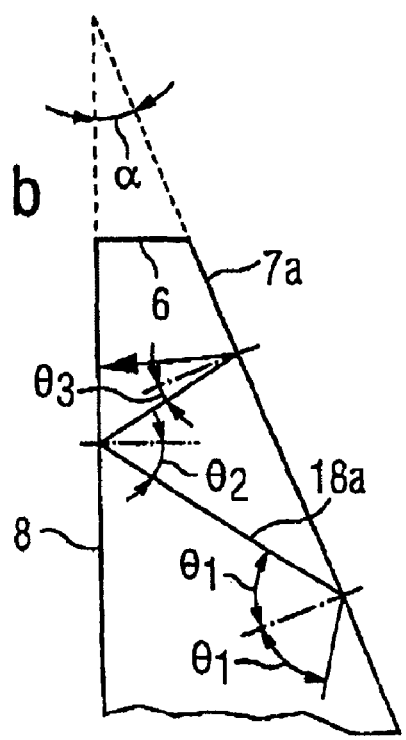

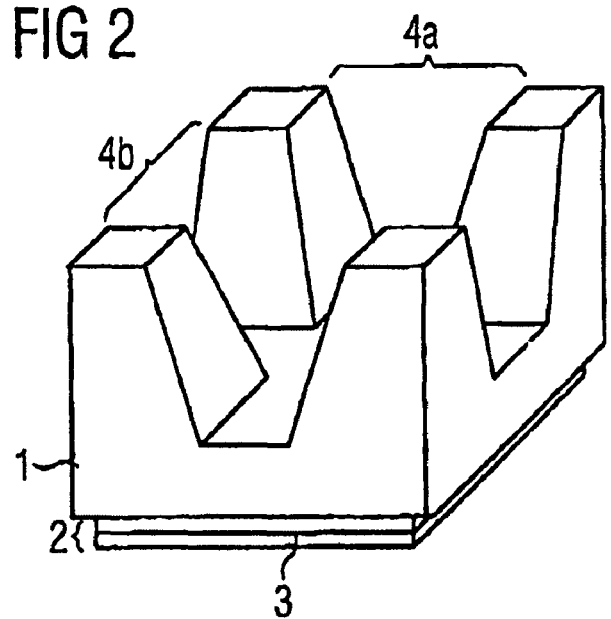
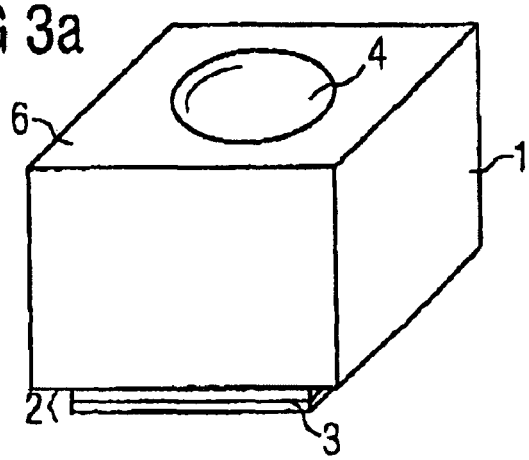
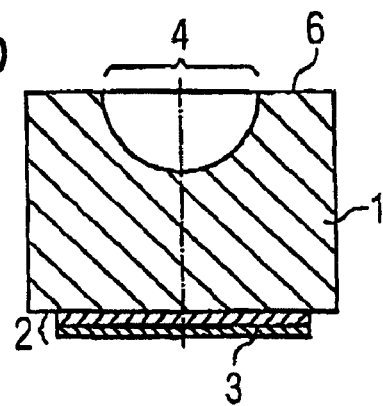

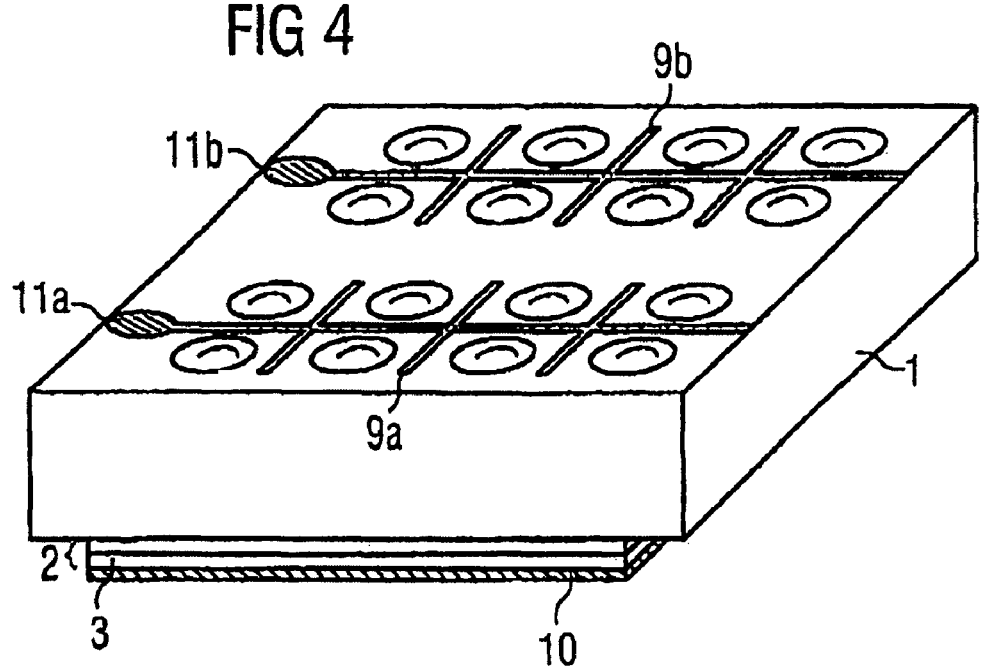
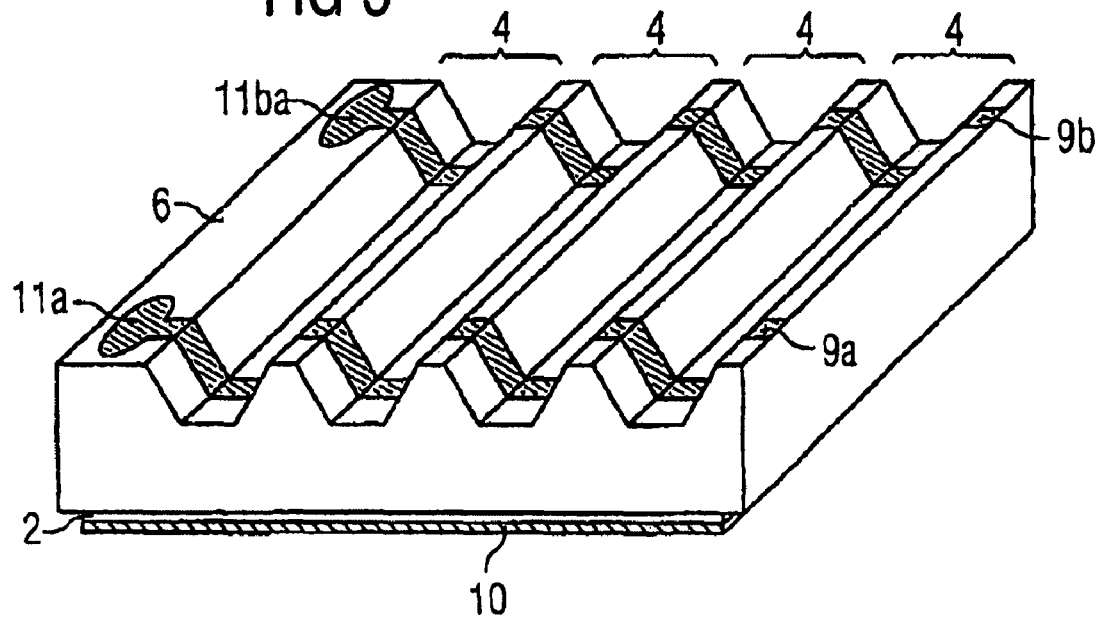

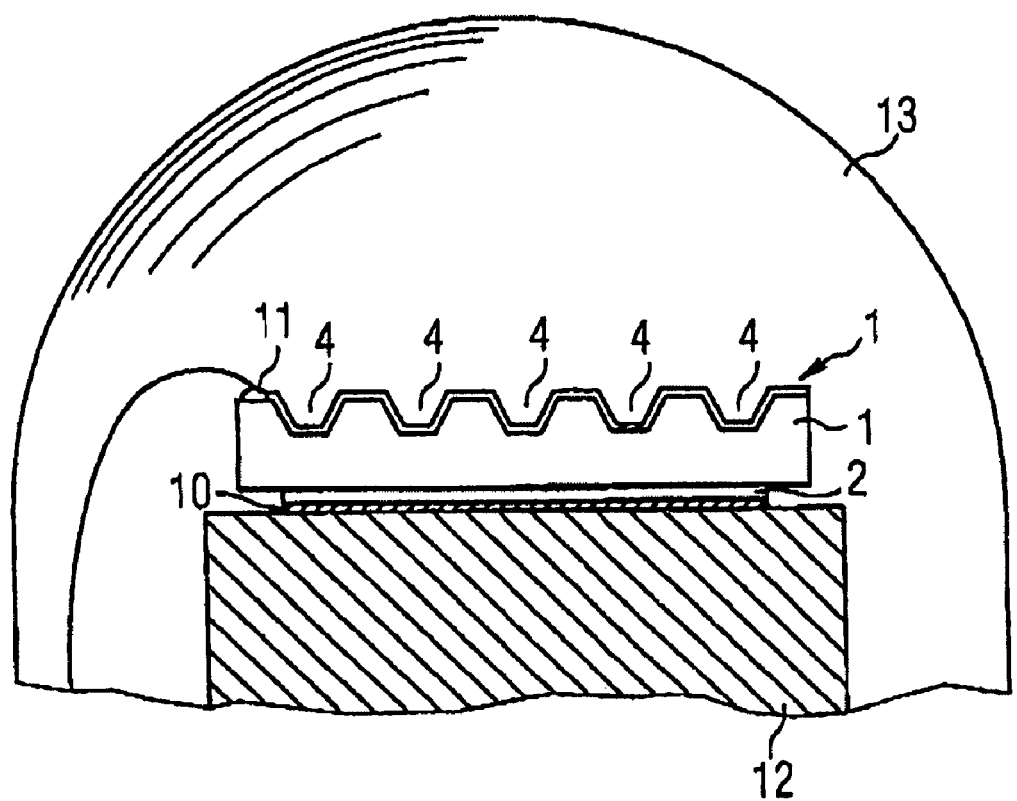
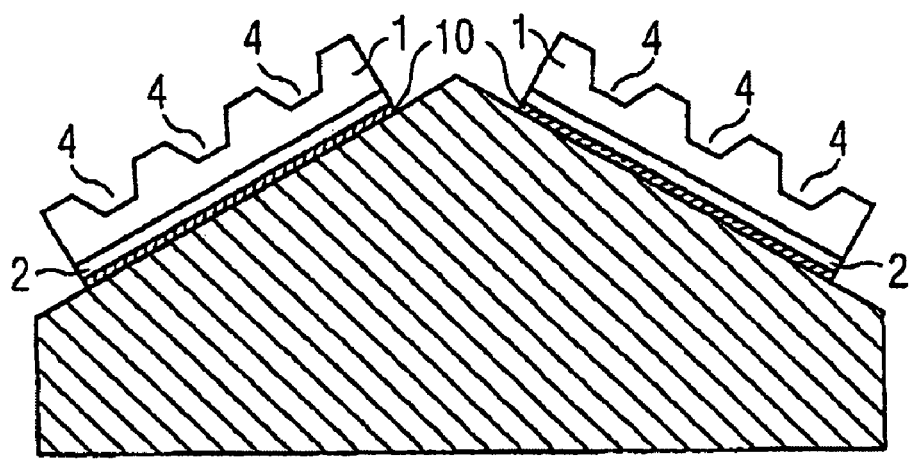

RADIATION-EMITTING SEMICONDUCTOR COMPONENT AND METHOD FOR PRODUCING THE SEMICONDUCTOR COMPONENT

CROSS-REFERENCE TO RELATED APPLICATIONS

This application is a continuation application and claims priority to U.S. Application Ser. No. 10/657,841, filed Sep. 9, 2003 now U.S. Pat. No. 7,169,632, which is a continuation application of International Application No. PCT/DE02/00514, filed Feb. 13, 2002, which claims priority to German Application Serial No. 10111501.6, filed on Mar. 9, 2001, the contents of which are incorporated by reference herein in their entirety.

BACKGROUND OF THE INVENTION

Field of the Invention

The invention lies in the field of semiconductor technology. More specifically, the invention relates to a radiation-emitting semiconductor component having a multilayer structure, an active layer serving for generating radiation within the multilayer structure, electrical contacts, which are electrically conductively connected to the active layer, and a radiation-transmissive window having a first main surface and a second main surface opposite to the first main surface. The first main surface of the window adjoins the multilayer structure. The invention also pertains to a method of producing such a radiation-emitting semiconductor component.

Radiation-emitting semiconductor components of the type mentioned generally have a semiconductor multilayer system with an active layer serving for generating radiation, which system is applied to a carrier. Radiation is coupled out through the carrier, the carrier being transparent with respect to the radiation thus generated. In that configuration, however, the radiation efficiency is greatly limited by total reflection at the carrier surface. This problem surface is particularly pronounced in the case of carriers having a high refractive index, such as SiC (silicon carbide) substrates for example, and it is further aggravated if the refractive index of the carrier is greater than the refractive, index of the multilayer system.

The influence of total reflection on the coupling-out of radiation is illustrated by way of an example in FIG. 9 using a prior art GaN-based multilayer system 20 on a parallelepipedal SiC substrate 19 that it rectangular in section. The SiC substrate 19 has a refractive index of about 2.7 and it represents the optically denser medium by comparison with the multilayer system 20, which has a refractive index of about 2.5. The semiconductor structure shown is surrounded by a medium having a low refractive index, for example air.

The multilayer structure 20 has an active radiation-generating layer 21. A small radiation-emitting volume 23, which can be described in an approximation as an isotropic point radiator, shall be picked out of the active layer 21. The following consideration is applicable to virtually all such partial volumes 21 of the active layer.

The radiation 22 emitted by the volume 23 in the direction of the SiC substrate 19 firstly impinges on the multilayer system/substrate interface and, upon entering the substrate is refracted in the direction of the normal to the interface.

Direct coupling-out of the radiation at the substrate main surface 25 opposite to the interface is possible only for radiation portions whose angle of incidence is less than the angle of total reflection (in each case relative to the normal to the coupling-out surface 25). For a substrate of high refractive index, the angle of total reflection is comparatively small and amounts to about 22° for SiC, for example.

Therefore, only a small portion 22c of the radiation generated is directly coupled out from the center of the beam pencil 22a, b, c. The remainder of the radiation generated in subjected to total reflection.

The radiation portion 22b subjected to total reflection at the coupling-out surface 25 subsequently impinges on the substrate side surface 26 at an even shallower angle and is once again subjected to total reflection.

The remaining radiation portions 22a, which first impinge on the side surfaces 26 of the substrate 19, are likewise subjected to total reflection firstly at the side surfaces 26 and then at the coupling-out surface 25.

In the case of the right-angled (i.e., orthogonal) configuration of side and main surfaces shown f, the angle of incidence undergoes transition after reflection into itself or the complementary angle, so that the radiation portions 22a, b cannot be coupled out at these our-faces even after multiple reflections.

Consequently, only a very small portion 22c of the entire radiation 22 emitted in the direction of the substrate 19 is coupled out. The remainder of the radiation 22a, b circulates in the substrate 19 while undergoing multiple total reflection, possibly enters the multilayer structure 20 again and is finally absorbed in the course of this cyclic propagation.

U.S. Pat. No. 6,229,160 and the corresponding German patent application DE 198 07 758 A1 disclose a light-emitting semiconductor component whose semiconductor side surfaces are completely or partly beveled in order to increase the radiation efficiency, so that the substrate acquires the form of a truncated pyramid. This beveling reduces the angle of incidence for parts of the radiation generated upon impingement on the side surfaces at the angle of total reflection, so that these radiation portions can be coupled out.

Since the additional coupling-out of radiation is effected only at the edge regions of the component, the radiation efficiency is increased only slightly, particularly in the case of large-surface components with comparatively thin substrates. Moreover, many placement installations are designed for semiconductor chips with a substrate in parallelepipedal or cuboid form. Changing the basic form of the substrate may lead to functional disturbances or necessitate costly conversions in the case of such installations.

SUMMARY OF THE INVENTION

It is accordingly an object of the invention to provide a radiation-emitting semiconductor component and a corresponding production method which overcome the above-mentioned disadvantages of the heretofore-known devices and methods of this general type and which provide for a radiation-emitting semiconductor component having an improved radiation efficiency.

With the foregoing and other objects in view there is provided, in accordance with the invention, a radiation-emitting semiconductor component, comprising:

a multilayer structure including an active layer for generating radiation in the multilayer structure;

electrical contacts connected to the active layer;

a radiation-transmissive window with a first main surface adjoining the multilayer structure and a second main surface; opposite the first main surface;

the second main surface having at least one void, such as a trench recess or a pit recess, formed therein for increasing a coupling-out of radiation from the window.

In other words, the invention provides for the formation of a radiation-emitting semiconductor component having a multilayer structure, an active layer serving for generating radiation within the multilayer structure, contacts electrically connected to the active layer, and a window which is transmissive for the radiation generated and has a first main surface and a second main surface opposite to the first main surface, the first main surface of the window adjoining the multilayer structure and at least one trench-like or pit-like recess being formed in the window from the second main surface for the purpose of increasing the radiation efficiency.

In this case, the recess is embodied in such way that parts of the radiation generated are coupled out at its boundary surfaces or reflected in a manner that promotes the coupling-out from the window.

A coupling-out of radiation portions is achieved by virtue of the fact that the boundary surfaces of the recess are at least partly arranged in such a way that the angle of incidence of said radiation portions on the boundary surfaces is as small as possible and, in particular, is less than the angle of total reflection.

Reflection promoting the coupling-out is present for example if radiation portions are firstly subjected to total reflection by the boundary surfaces of the recess, the cyclic propagation being broken within the window, so that the relevant radiation portions can be coupled out at least after a few further reflections at a boundary surface of the window.

The interruption of a cyclic propagation has the effect of increasing the radiation efficiency particularly in the case of a window whose side surfaces are arranged perpendicularly to the main surfaces. As described in the introduction, cyclically propagating radiation pencils form very easily in the case of such arrangements with a cubic or parallelepipedal window, with the result that the proportion of radiation that cannot be coupled out is correspondingly high.

Increasing the radiation efficiency by means of a recess in the window advantageously requires no changes to the enveloping basic form of the window, so that production and placement installations whose function is defined for specific predetermined basic forms of the window can also be used for producing components according to the invention. The invention can achieve, in particular, a high radiation efficiency with known and established basic forms of window such as, for example, an enveloping cube or parallelepiped form.

In order to further increase the radiation efficiency, preferably a plurality of recesses are formed in the window in the case of the invention. A plurality of uniform recesses is particularly preferred with regard to the number of production steps, which is to be kept low.

In contrast to edge structuring of the window in order to increase the radiation efficiency, for example by beveling the side surfaces, the invention can achieve an improved coupling-out over a larger surface and a more uniform distribution of the coupled-out radiation on this surface. This is particularly advantageous for large-surface components since, with the component surface scaled upward, the ratio of periphery to surface decreases. Therefore, in the case of large-surface components, means for increasing the radiation efficiency that are restricted to the periphery of the components are generally far less efficient than means for increasing the radiation efficiency that are applied in the surface.

In a preferred refinement of the invention, the recess in the window has at least one planar side surface, which forms an angle that differs from 90.1 with the second main surface of the window. Said angle is particularly preferably between 20° and 70°. Such a recess may be realized for example in the form of a trench with side walls which are inclined with respect to the main surfaces, which trench can be produced for example by correspondingly sawing into the window. Such a trench preferably has a trapezoidal cross section tapering in the direction of the multilayer structure.

In order to further increase the radiation efficiency, it the also possible to form a plurality of trenches that cross one another or run parallel. A parallel arrangement brings about an asymmetrical directional characteristic of the radiation generated, while trenches that cross one another lead to a uniform distribution of the coupled-out radiation. One of the two embodiments may be more advantageous depending on the surface of application.

In a further preferred refinement of the invention, the recess is completely or partly bounded by curved surfaces. In an advantageous manner, reflection at curved boundary surfaces of a recess largely precludes cyclic propagations. In this case, the recesses may be formed in particular in the form of a hemisphere, a sphere segment, an ellipsoid segment, a cone or a truncated cone. Similar forms which emerge for example from the abovementioned basic forms through distortions such as stretching, compression or shearing are also suitable.

Such forms can be produced for example by laser ablation or etching. The abovementioned trench-type recesses may also be bounded by curved surfaces and be formed for example with a semicircular cross section.

In a preferred development of the invention, the multilayer structure is produced by epitaxy. The window may subsequently also be produced from the epitaxial substrate. The invention has particular advantages in the case of substrates of high refractive index such as sic, for example, with correspondingly large total reflection ranges, particularly when the refractive index of the substrate is greater than the refractive index of the multilayer structure. In this case, the refractive index of the multilayer structure is to be understood as the refractive index of that region of the multilayer structure which adjoins the substrate, since the extent of total reflection is significantly determined by the jump in refractive index at the interface between substrate and multilayer structure. The multilayer structure is generally composed of materials which have negligible differences in refractive index with respect to one another compared with the refractive index of the substrate. Therefore, the average refractive index of the materials contained in the multilayer structure can also be used as the refractive index of said multilayer structure.

As described in the introduction, this case arises primarily with GaN-based multilayer structures. These are multilayer structures which contain GaN or a compound that is derived therefrom or related thereto. These include, in particular, GaN itself, mixed-crystal systems based thereon, such as AlGaN ($Al_{1-x}Ga_xN$, $0 \leq x \leq 1$), InGAN ($In_{1-x}Ga_xN$, $0 \leq x \leq 1$) and AlInGaN ($Al_{1-x-y}In_xGa_yN$, $0 \leq x \leq 1$, $0 \leq y \leq 1$) and also AlN, InN and InAlN ($In_{1-x}Al_xN$, $0 \leq x \leq 1$).

Such multilayer structures are usually grown by epitaxy on an SiC or sapphire substrate which is at least partly transparent to the radiation generated, principally in the blue and green spectral region. In the case of both substrates, the invention can increase the radiation efficiency by reducing the total reflection losses, the invention being particularly advantageous for SiC substrates on account of the problem surface resulting from the high refractive index as described in the introduction.

However, the invention is not restricted to GaN-based systems, but rather may likewise be applied to other semiconductor systems such as, for example, to GaAs- GaP- or ZnSe-based materials. Here, too, a considerable part of the radiation generated remains in the multi-layer structure/window arrangement on account of total reflection and is finally absorbed.

Likewise, the invention is also advantageous for window materials other than those mentioned-hitherto, for example quartz glass, diamond, ITO (indium tin oxide) or materials based on ZnO, SnO, InO or GaP, since it is generally the case with all these windows that, during the coupling-out, there is a transition to an optically leas dense medium at which total reflection can occur and the degree of coupling-out is correspondingly reduced.

Furthermore, the invention is also advantageous for semiconductor bodies or windows that are potted or provided with an encapsulation in some other way, since the encapsulation generally has the lower refractive index, so that the radiation efficiency is reduced by total reflection in this case as well.

A window made of the abovementioned materials may be applied to the multilayer structure after the production of the latter. During the epitaxial production, this is possible for example in that after the epitaxy the epitaxial substrate is stripped away and in place thereof the window is connected to the multilayer structure by means of a wafer bonding method. As an alternative, the window may also be applied to the semiconductor surface produced by epitaxy and afterward the epitaxial substrate may be stripped away. This procedure has the advantage that the epitaxial substrate can be reused, which leads to significant coot advantage particularly in the case of: expensive materials such as SiC substrates, for example.

A method according to the invention for producing a radiation-emitting semiconductor component of the type mentioned begins with the provision of a window layer, for example in the form of a suitable substrate or wafer, having a first main surface and a second main surface opposite to the first main surface.

In the next step, a semiconductor layer sequence corresponding to the multilayer structure to be formed is applied to the first main surface. The application is preferably by epitaxy or by means of a water-bonding method.

Afterward, a saw blade with a shaping edge is used to saw into the window layer from the second main surface and a trench-type recess is thus formed in the substrate. In this case, the cutting depth is less than the thickness of the window layer.

The components are finally completed. This comprises, for is example, contact connection and singulation of the semiconductor layer sequence. During singulation, the composite comprising window layer and semiconductor layer sequence is divided into a plurality of windows each with a multilayer structure arranged thereon.

As an alternative, the recesses can also be etched using a suitable mask technique or produced by means of laser ablation. This alternative makes it possible to form spatially isolated recesses, that is to say recesses which do not extend over the entire surface of the window layer or larger partial regions thereof.

Isolated recesses may be formed as described above, for example, in the shape of a cone, a truncated cone, a hemisphere, a sphere segment, an ellipsoid segment or a similar form.

Other features which are considered as characteristic for the invention are set forth in the appended claims.

Although the invention is illustrated and described herein as embodied in a radiation-emitting semiconductor component and method for producing it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1A is a diagrammatic perspective, partly sectional illustration of a first exemplary embodiment of a, semiconductor component according to the invention;

FIG. 1B is a diagrammatic detail view of a portion of the component of FIG. 1A:

FIG. 2 is a diagrammatic perspective illustration of a second exemplary embodiment of a semiconductor component according to the invention;

FIG. 3A is a diagrammatic perspective view of a third exemplary embodiment of a semiconductor component according to the invention;

FIG. 3B in a sectional view thereof;

FIG. 4 is a diagrammatic perspective view of, a fourth exemplary embodiment of a semiconductor component according to the invention;

FIG. 5 shows a diagrammatic perspective illustration of a fifth exemplary embodiment of a semiconductor component according to the invention;

FIG. 7 is a diagrammatic sectional view off a seventh exemplary embodiment of a semiconductor-component according to the invention;

FIG. 8 is a diagrammatic sectional illustration of an eighth exemplary embodiment of a semiconductor component according to the invention.

DESCRIPTION OF THE PREFERRED EMBODIMENTS

Figure 6:
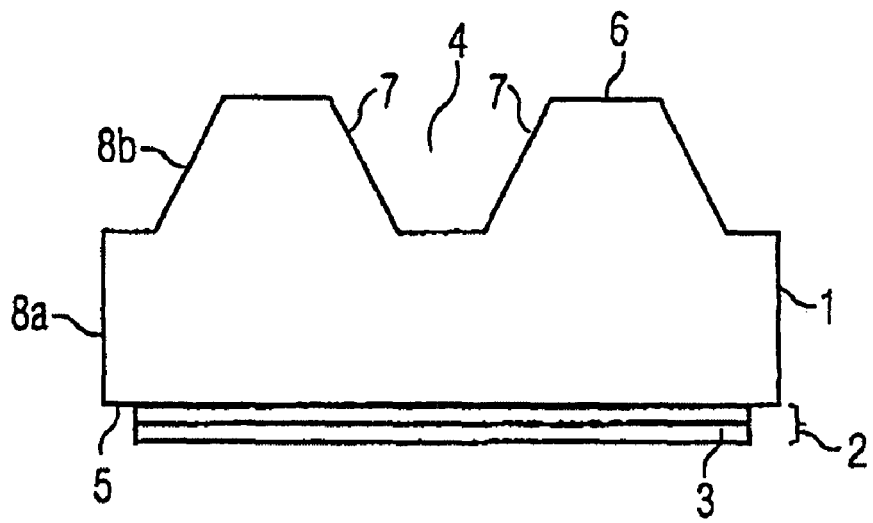
FIG. 6 is a diagrammatic sectional, view of sixth exemplary embodiment of a semiconductor component according to the invention.
Figure 9:
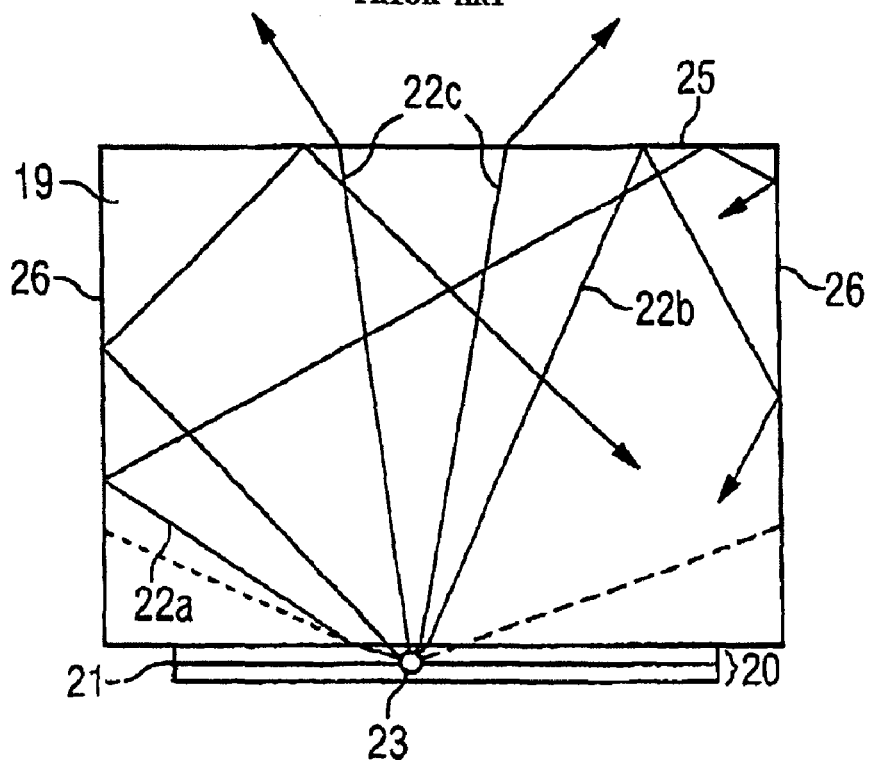
FIG. 9 is a diagrammatic sectional illustration of a semiconductor component according to the prior art.

Referring now to the figures of the drawing in detail and first, particularly, to FIG. 1A thereof, the first exemplary embodiment has a window 1 with a first main surface 5, a second main surface 6, and a multilayer structure 2 applied to the first main surface 5.

The multilayer structure 2 comprises a plurality of semiconductor layers of the GaN/AlGaN system. The multilayer structure 2 contains an active layer 3, which generates radiation 18 during operation (illustrated by way of example using the rays 18a, b, c).

The window 1 is produced from an SiC epitaxial substrate used for the epitaxial production of the multilayer structure 2 and has a trench-type recess 4 with a trapezoidal cross section, which has already been formed in the epitaxial substrate, preferably after the epitaxy.

Apart from this recess 4, the window 1 has a parallelepipedal enveloping basic form. As described in the introduction, in the case of such a device having a substrate whose refractive index is greater than the refractive index of the multilayer structure, the coupling-out of the radiation generated is greatly limited through the window sidewalls 8 on account of total reflection.

By virtue of the beveling of the aide surfaces 7a, b of the trench-type recess 4, the angle of incidence is lowered for a part 18b, c of the radiation reflected from the sidewall 8 of the window to such an extent that it is less than the angle of total reflection and the radiation can thus emerge from the window.

Radiation portions 18a which, despite the inclination of the corresponding sidewall 7a, are incident so shallowly that they are subjected to total reflection at the sidewall 7a are reflected back and forth between the window sidewall 8 and the side surface of the recess 7a, the angle of incidence decreasing after each reflection until a coupling-out is finally possible. This is elucidated for illustration purposes in the detail sectional view in FIG. 1B.

The angle $\alpha$ denotes the angle between the side surface of the recess 7a and the sidewall of the window 8. A ray 18a impinging on the recess side surface 7a at an angle $\theta_1$ of incidence ($\theta_1 > \theta_c$, where $\theta_c$ is the angle of total reflection) is reflected back to the sidewall 8 under total reflection. The angle $\theta_2$ of incidence on the window sidewall 8 is reduced by the magnitude $\alpha$ compared with the angle $\theta_1$ of incidence during the prior reflection.

$$\theta_2 = \theta_1 - \alpha$$

If, as illustrated, $\theta_2$ is greater than the angle $\theta_c$ of total reflection, the ray 18a is reflected back to the side surface 7a, where it impinges at the angle of incidence $$\theta_3 = \theta_2 - \alpha = \theta_1 - 2\alpha$$

Thus, the angle of incidence is reduced by the magnitude $\alpha$ during each reflection until a coupling-out can take place.

The exemplary embodiment shown in FIG. 2 differs from the previous example in that, two recesses 4a, b which cross one another at a right angle are formed in the window 1, each recess being embodied in the form of a trench with a trapezoidal cross section. As a result, the total coupling-out surface and thus also the radiation efficiency are advantageously increased further.

The recess described are preferably produced after the epitaxial production of the multilayer structure 2 by sawing into the epitaxial substrate on the side remote from the multi layer structure using a saw blade with a shaping edge. In this case, the shaping edge has, in cross section (section transversely with respect to the sawing direction), the complementary form corresponding to the desired trench cross section.

The exemplary embodiment shown in FIG. 2 is correspondingly produced by means of two sawing cuts that cross one another. In this case, the sawing depth is less than the window thickness in order not to damage the multilayer structure 2. The exemplary embodiment illustrated in perspective in FIG. 3a differs from the previously described exemplary embodiment in that a spatially isolated, peripherally delimited recess 4 in the form of a hemisphere is formed in the window. Such peripherally delimited recesses are preferably etched into the window 1, in contrast to trench-type recesses. FIG. 3b shows a central section through the exemplary embodiment, said section being perpendicular to the multilayer sequence 2.

The production of recesses by etching is suitable in particular for forming a multiplicity of recesses in a window 1, as are illustrated for example in FIG. 4. With the use of a suitable mask technique based on known technologies, it is possible in this case for all the recesses to be produced, cost-effectively in a single production step. The components thus formed are distinguished by a high radiation efficiency and a particularly uniform distribution of radiation on the coupling-out surface.

In the exemplary embodiment illustrated in FIG. 4, the contact connection is effected by means of metalized contact strips 9a, b which run between the recesses and respectively end in a wire connection region 11a, b. As mating contact, a contact surface 10 is applied to that side of the multilayer structure 2 which is remote from the window 1. Said contact surface 10 may be formed for example as a reflective surface. Radiation portions impinging on the contact surface are thereby reflected back again in the direction of the coupling-out surface 6. A contact surface formed in whole-surface fashion is advantageous for introducing current into the multilayer structure as uniformly as possible.

FIG. 5 likewise shows an exemplary embodiment with a plurality of recesses 4 in a window 1, which, in contrast to the previous exemplary embodiment, are arranged as trenches parallel to one another. The form of the individual recesses corresponds to the exemplary embodiment in accordance with FIG. 1. Such a structure can easily be produced by multiple parallel sawing-in using a shaping edge saw blade. This shaping is suitable in particular for large-surface semiconductor components.

The contact connection of the component is once again effected by means of two metalized strips 9a, b which are applied to the main surface 6 and the recesses 4 near the edge and respectively end in a wire connection region 11a, b. The corresponding mating contact is formed as a rear-side contact layer 10 on the multilayer structure 2.

The window sidewalls are partly beveled in the exemplary embodiment illustrated in FIG. 6, in contrast to the exemplary embodiments described above. In this case, the window sidewalls have, on the part of the first window main surface 5, a first partial region 8a orthogonal to the main surface 5. This first partial region 8a undergoes transition, in the direction of the second main surface 6, to a second partial region 8b arranged obliquely with respect to the main surfaces 5 and 6. Furthermore, as in the exemplary embodiment illustrated in FIG. 1, a recess 4 with inclined side surfaces 7 is formed in the window 1.

The radiation efficiency is advantageously increased further by this shaping since the beveled regions 8b of the window sidewalls reduce the proportion of radiation subjected to total reflection in a similar manner to the inclined side surfaces 7 of the recess 4. In the first partial region 8a of the window sidewalls, the window additionally has, a parallelepipedal basic form which, as described, facilitates the mounting of the semiconductor component and is advantageous in particular for automatic placement installations. It goes without saying that the parallelepipedal basic form can also be entirely dispensed with in order to achieve an even higher radiation efficiency.

FIG. 7 shows an exemplary embodiment of, an optical component containing a radiation-emitting semiconductor component according to the invention. The semiconductor component corresponds to the exemplary embodiment in accordance with FIG. 5 and is applied to a metallic heat sink 12, for example a copper block. The heat sink is electrically conductively connected to the contact layer 10 formed on the rear side on the multilayer structure 2 and serves both for heat dissipation and for contact connection. In this case, the semiconductor component may be soldered or adhesively bonded onto the heat sink 12 by means of an electrically conductive adhesive.

The semiconductor component is covered with a potting 13 on the radiation side. Said potting comprises a reaction resin, preferably an epoxy, acrylic or silicone resin, which, inter alia, serves to protect the semiconductor component from harmful ambient influences.

In addition, the potting may also serve as a carrier or matrix for a radiation conversion element. Thus, by way of example, by suspending a suitable dye into the potting compound, it is possible to produce a component which radiates polychromatic light, that is to say light of a mixed color, comprising the light of the semiconductor component and the light converted by the dye. With the use of a semiconductor component which emits in the blue spectral region and a dye which, upon excitation in said spectral region, emits light in the yellow-orange spectral region, a semiconductor-based white light source is created in this way.

FIG. 8 shows a further exemplary embodiment of an optical component. Here, two semiconductor components corresponding to the exemplary embodiment in accordance with FIG. 5 are applied to an angled heat sink 12. A potting has been dispensed with since the shaping of the window layer already increases the coupling-out compared with components according to the prior art. The risks associated with a potting for the component, such as, for example, the risk of a delamination of the potting from the semiconductor body or a possible ageing and yellowing of the potting, are also obviated as a result.

As an alternative, of course, it, is possible to cover the semiconductor component by means of a potting if the latter is desirable for example in order to protect the semiconductor body, in order to form an optical element such as a lens, for instance, in order to further increase the radiation efficiency or as a matrix for luminescent materials.

The shaping of the window layer shown and, in particular, the formation of recesses in the form of a plurality of parallel trenches have the effect that the radiation generated, is radiated in a directional manner. Taking account of this directional radiating characteristic it is possible to produce modules with a plurality of semiconductor components which have a more complex radiating characteristic. Such more complex radiating characteristics, generally require additional complicated optics. The latter and likewise a reflector can advantageously be dispensed with in the case of the invention, so that modules of this type can be arranged in a particularly space-saving manner.

The scope of protection of the invention is not limited to the examples given hereinabove. The invention is embodied in each novel characteristic and each combination of characteristics, which includes every combination of any features which are stated in the claim, even if this combination of features is not explicitly stated in the claims.

This application claims the priority benefit of German patent application DE 1001 11 501, which is herewith incorporated by reference.

What is claimed is:

1. A radiation-emitting semiconductor component, comprising:
   a multilayer structure including an active layer for generating radiation in said multilayer structure;
   electrical contacts connected to said active layer; and
   a radiation-transmissive window with a first main surface adjoining said multilayer structure and a second main surface opposite said first main surface, wherein said window contains a material selected from the group consisting of ITO, SnO, ZnO, and InO; and
   said second main surface having at least one void selected from the group consisting of a trench recess and a pit recess formed therein for increasing a coupling-out of radiation from said window;
   wherein at least part of the radiation generated in the radiation-emitting semiconductor component is transmitted through a side surface of the void.

2. The semiconductor component according to claim 1, wherein said window is formed with side surfaces perpendicular to said first and second main surfaces.

3. The semiconductor component according to claim 1, wherein said window is formed with side surfaces having partial regions orthogonal to said first and second main surfaces.

4. The semiconductor component according to claim 1, wherein said window has an enveloping cuboid basic shape.

5. The semiconductor component according to claim 1, wherein said void has at least one planar side surface enclosing an angle between 20° and 70° with said second main surface.

6. The semiconductor component according to claim 1, wherein said void has a bottom surface substantially parallel to said second main surface.

7. The semiconductor component according to claim 1, wherein said void is a trench recess formed with a triangular or trapezoidal cross section tapering toward said first main surface.

8. The semiconductor component according to claim 1, wherein said at least one void is one of a plurality of trench recesses formed in said window.

9. The semiconductor component according to claim 8, wherein
   at least two trench recesses of said plurality of trench recesses cross one another.

10. The semiconductor component according to claim 1, wherein said void is bounded by at least one curved surface.

11. The semiconductor component according to claim 10, wherein said void has a form substantially describing a hemisphere, a sphere segment, an ellipsoid segment, a cone, or a truncated cone.

12. The semiconductor component according to claim 1, wherein said window has a refractive index greater than a refractive index of said multilayer structure.

13. The semiconductor component according to claim 1, wherein said multilayer structure is based on GaN.

14. The semiconductor component according to claim 13, wherein said multilayer structure contains at least one gallium compound selected from the group consisting of GaN, Al1-xGaxN ($0 \leq x \leq 1$), In1-xGaxN ($0 \leq x \leq 1$), and Al1-x-yInxGayN ($0 \leq x \leq 1$), ($0 \leq y \leq 1$).

15. The semiconductor component according to claim 1 wherein said multilayer structure is an epitaxy product.

16. The semiconductor component according to claim 15, wherein said multilayer structure is deposited on an epitaxial substrate and said window is produced from said epitaxial substrate.

17. The semiconductor component according to claim 15, wherein said multilayer structure is deposited on an epitaxial substrate and said epitaxial substrate is stripped away after the epitaxy.

18. The semiconductor component according to claim 1, wherein said window is connected to said multilayer structure by a wafer bonding process.

19. The semiconductor component according to claim 1, wherein the semiconductor component is arranged on a heat sink.

20. The semiconductor component according to claim 19, wherein said heat sink is a metal heat sink.

21. The semiconductor component according to claim 1, wherein the semiconductor component is part of an optical component, said optical component being capable of radiating polychromatic light.

22. The semiconductor component according to claim 21, wherein the semiconductor component is covered with a potting, said potting serving as a carrier or as a matrix for a radiation conversion element, the polychromatic light radiated by the optical component comprising light of the semiconductor component and light converted by the radiation conversion element.

23. An optical component comprising:
an angled heat sink and
at least two semiconductor components according to claim 1,
wherein the at least two semiconductor components are applied to at least two different surfaces of said angled heat sink.

24. A method for producing a semiconductor component, the method comprising:
providing a window layer having a first main surface and a second main surface opposite the first main surface;
applying a semiconductor layer sequence to the first main surface of the window layer;
forming at least one recess in the window layer from the second main surface; and
completing the semiconductor component according to claim 1.

25. The method according to claim 24, which comprises forming the recess by sawing into the window layer on the second main surface.

26. The method according to claim 25, which comprises sawing with a saw blade having a shaping edge.

27. The method according to claim 26, which comprises sawing with a saw blade having a trapezoidal cross section in a sawing region.

28. The method according to claim 24, which comprises etching the recess into the second main surface.

29. The method according to claim 24, which comprises forming the recess with a laser ablation process.

30. The semiconductor component according to claim 1, wherein said window contains ITO.

31. The semiconductor component according to claim 3, wherein radiation generated by the active layer is primarily emerges from the window through side surfaces of the window, side surfaces of the void, and the second main surface of the window.

* * * * *

UNITED STATES PATENT AND TRADEMARK OFFICE
CERTIFICATE OF CORRECTION

PATENT NO. : 8,138,511 B2
APPLICATION NO. : 11/567977
DATED : March 20, 2012
INVENTOR(S) : Johannes Baur et al.

It is certified that error appears in the above-identified patent and that said Letters Patent is hereby corrected as shown below:

On the title page, below Abstract, "31 Claims, 5 Drawing Sheets" should be corrected to read
-- 32 Claims, 5 Drawing Sheets --.

Page 2, U.S. PATENT DOCUMENTS, first column, after line 5, insert -- 5,854,088 A
12/1998 Plais et al. --.

Page 2, U.S. PATENT DOCUMENTS, first column, after line 11, insert -- 6,225,195 B1
5/2001 Iyechika et al. --.

Page 2, FOREIGN PATENT DOCUMENTS, second column, before line 1,
insert -- DE 198 35 008 A1 2/1999 --.

In Claim 14, column 10, lines 40-41, delete "Al1-xGa$_x$N (0☐x   1), In1-xGaxN (0   x   1), and Al1-x-yInxGayN (0   x   1), 0   y   1)." and insert -- $Al_{1-x}Ga_xN$ ($0 \leq x \leq 1$), $In_{1-x}Ga_xN$ ($0 \leq x \leq 1$), and $Al_{1-x-y}In_xGa_yN$ ($0 \leq x \leq 1$), $0 \leq y \leq 1$). --.

In Claim 15, column 10, line 42, after "1" insert -- , --.

Column 11, after Claim 24, insert -- 25. The method according to claim 24, which comprises depositing the semiconductor layer sequence on the window layer by epitaxy. --.

Column 12, line 1, delete "25" and insert -- 26 --.

Column 12, line 4, delete "26" and insert -- 27 --.

Column 12, line 6, delete "27" and insert -- 28 --.

Column 12, line 9, delete "28" and insert -- 29 --.

Signed and Sealed this
Fifth Day of February, 2013

Teresa Stanek Rea
*Acting Director of the United States Patent and Trademark Office*

Column 12, line 11, delete "29" and insert -- 30 --.

Column 12, line 13, delete "30" and insert -- 31 --.

Column 12, line 15, delete "31" and insert -- 32 --.